(12) United States Patent
Bellipaddy et al.

(10) Patent No.: US 7,937,647 B2
(45) Date of Patent: May 3, 2011

(54) ERROR-DETECTING AND CORRECTING FPGA ARCHITECTURE

(75) Inventors: Vidyadhara Bellipaddy, San Jose, CA (US); Gregory Bakker, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 948 days.

(21) Appl. No.: 11/829,335

(22) Filed: Jul. 27, 2007

(65) Prior Publication Data

US 2009/0031194 A1 Jan. 29, 2009

(51) Int. Cl.
*G11C 29/00* (2006.01)
*H03M 13/00* (2006.01)

(52) U.S. Cl. .................. 714/774; 714/773; 714/780
(58) Field of Classification Search .................. 714/774, 714/773, 780
See application file for complete search history.

(56) References Cited

U.S. PATENT DOCUMENTS

| | | | | | |
|---|---|---|---|---|---|
| 4,047,151 | A * | 9/1977 | Rydbeck et al. | ............... | 714/774 |
| 5,568,426 | A * | 10/1996 | Roohparvar et al. | .... | 365/185.22 |
| 5,621,682 | A * | 4/1997 | Tanzawa et al. | ......... | 365/185.03 |
| 5,715,193 | A * | 2/1998 | Norman | ................... | 365/185.02 |
| 5,920,501 | A * | 7/1999 | Norman | ................... | 365/185.02 |
| 5,963,473 | A * | 10/1999 | Norman | ................... | 365/185.02 |
| 6,101,624 | A * | 8/2000 | Cheng et al. | ................... | 714/736 |
| 6,838,899 | B2 * | 1/2005 | Plants | ............... | 326/9 |
| 7,075,328 | B2 * | 7/2006 | Plants | ............... | 326/9 |
| 7,080,305 | B2 * | 7/2006 | Welbon et al. | ............... | 714/752 |
| 7,111,224 | B1 * | 9/2006 | Trimberger | ................... | 714/764 |
| 7,127,552 | B2 * | 10/2006 | Shimanek et al. | ............ | 711/103 |
| 7,143,329 | B1 * | 11/2006 | Trimberger et al. | .......... | 714/746 |
| 7,162,644 | B1 * | 1/2007 | Trimberger | ................... | 713/189 |
| 7,173,448 | B2 * | 2/2007 | Plants | ............... | 326/9 |
| 7,219,237 | B1 * | 5/2007 | Trimberger | ................... | 713/193 |
| 7,254,800 | B1 * | 8/2007 | Trimberger | ................... | 716/117 |
| 7,583,532 | B2 * | 9/2009 | Prasad | ................... | 365/185.09 |
| 7,724,580 | B2 * | 5/2010 | Li et al. | ................... | 365/185.22 |
| 7,826,263 | B2 * | 11/2010 | Lee et al. | ................... | 365/185.09 |
| 2003/0046631 | A1 * | 3/2003 | Gappisch et al. | ............. | 714/763 |

* cited by examiner

*Primary Examiner* — Joseph D Torres
(74) *Attorney, Agent, or Firm* — Lewis and Roca LLP

(57) ABSTRACT

A method and apparatus are provided for an error-correcting FPGA. ECC data for configuration is generated and programmed into the ECC rows in the configuration memory. While booting, it is determined whether an integrity-check bit is set. If so, an integrity check is performed. If a single-bit error is detected, if the bit error is an erroneous "0" value, the memory location containing the erroneous "0" value is reprogrammed to a "1" value. If the bit error is an erroneous "1," value, the memory block data is saved in a non-volatile memory block, the configuration memory block containing the error is erased and reprogrammed using the corrected bit. If there is more than one error, an error flag is set. The user reads the status of the error flag through the JTAG port. If the error flag is set then a full reprogramming cycle is initiated.

5 Claims, 4 Drawing Sheets

_US 7,937,647 B2_

ERROR-DETECTING AND CORRECTING FPGA ARCHITECTURE

BACKGROUND OF THE INVENTION

1. Field of the Invention

The present invention relates to programmable logic devices such as field-programmable gate array (FPGA) integrated circuits. More particularly, the present invention relates to FPGA integrated circuits using non-volatile memory for providing configuration information for the FPGA and to a non-volatile FPGA configuration memory with an ECC generator/checker for generating ECC information and memory cells reserved for storage of ECC information generated by the ECC generator/checker.

2. The Prior Art

An FPGA includes programmable circuitry that is configured and interconnected using programmable elements. Some FPGA integrated circuits employ non-volatile memory cells, such as flash memory cells, as the programmable elements. Whenever the state of a single memory cell in a non-volatile-memory-based FPGA changes due to ionizing radiation or for any other reason, there is presently no way to detect the failure. Because the FPGA configuration depends on the programmed or unprogrammed status of the non-volatile memory cells, any change in the contents of the configuration memory is likely to have disastrous consequences for the circuit implemented in the FPGA integrated circuit.

BRIEF DESCRIPTION OF THE INVENTION

An FPGA integrated circuit includes a non-volatile-memory programming controller. A non-volatile FPGA configuration memory is coupled to the non-volatile-memory programming controller and has a group of configuration non-volatile memory cells into which FPGA configuration data is written by the non-volatile-memory programming controller. An ECC generator/checker is coupled to the non-volatile-memory programming controller and generates ECC data from the FPGA configuration data written into the group of configuration non-volatile memory cells. A group of ECC data memory cells is coupled to the non-volatile-memory programming controller into which the ECC data is written by the non-volatile memory programming controller.

In an exemplary method according to the present invention, during programming of the FPGA, ECC data is generated and programmed into the ECC rows. An integrity-check bit may be set, for example, at the factory if it is desired to check the integrity of the memory bits at boot up. This gives the user the ability to trade boot up time with reliability. While booting up, it is determined whether the integrity-check bit is set. If the integrity-check bit is set, an integrity check is performed during boot-up to detect errors. If a single-bit error is detected, the location is known and the particular bit is reprogrammed. If the error bit should have been programmed and has become erased, the bit is reprogrammed. If the error bit should have remained erased and has become programmed, then the data is saved in a non-volatile memory (NVM) block, and the configuration memory block containing the error is then erased and reprogrammed using the corrected bit. If there is more than one error, an error flag may be set. In some embodiments, the user reads the status of the error flag through the JTAG port. If the error flag is set then a full reprogramming cycle is initiated.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
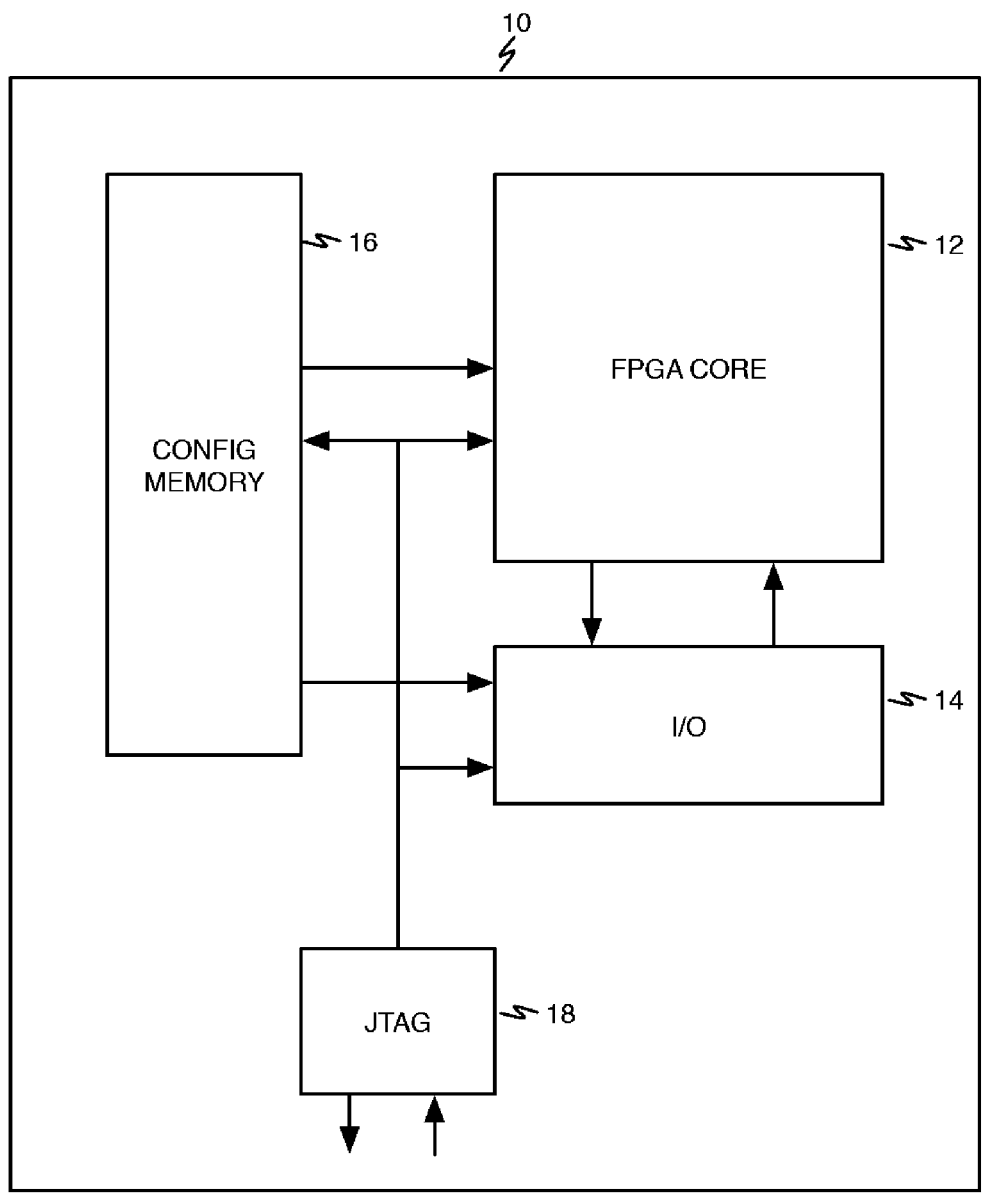
FIG. 1 is a simplified block diagram of an illustrative non-volatile memory based FPGA integrated circuit according to the present invention.

Referring first to FIG. 1, a simplified block diagram shows an illustrative non-volatile memory based FPGA integrated circuit 10 according to the present invention. Persons of ordinary skill in the art will appreciate that FPGA 10 may also include additional circuit blocks, such as user memory and other circuit blocks that are not shown in FIG. 1.

As is known in the art, FPGA 10 includes and FPGA core 12 that includes a plurality of programmable circuit elements and programmable interconnect elements that are used to configure the user circuit. FPGA core 12 is coupled to input/output (I/O) block 14. I/O block 14 includes a plurality of I/O circuits that can be programmably connected to the circuit elements in the FPGA core 12. As is known in the art, the I/O circuits may themselves be configurable by a user. The I/O circuits are coupled to I/O pads that are used to move signals on and off of the FPGA 10.

FPGA 10 also includes a configuration memory 16. Configuration memory 16 is a non-volatile memory that may be formed using any one of a number of available non-volatile memory technologies. While the present invention is disclosed using flash memory as an example, persons of ordinary skill in the art will understand that the present invention is not limited to FPGA integrated circuits that employ flash memory as the non-volatile configuration memory 16. The non-volatile configuration memory 16 includes a plurality of sense transistors that are coupled to transistor switches. As is known to persons of ordinary skill in the art, the state of a sense transistor determines whether its associated switch transistor is in an on state or in an off state. The individual transistor switches are coupled to the programmable circuit elements and programmable interconnect elements in the FPGA core 12 as is known in the art.

Configuration memory 16 is coupled to a port 18, such as a JTAG port, that is used to load configuration data into the FPGA 10. As is known to persons of ordinary skill in the art, the JTAG port 18 may be used for other purposes in addition to loading configuration data into the FPGA 10 and is therefore shown coupled to the FPGA core 12 and the I/O block 14 as well as to the non-volatile configuration memory 16.

Figure 2:
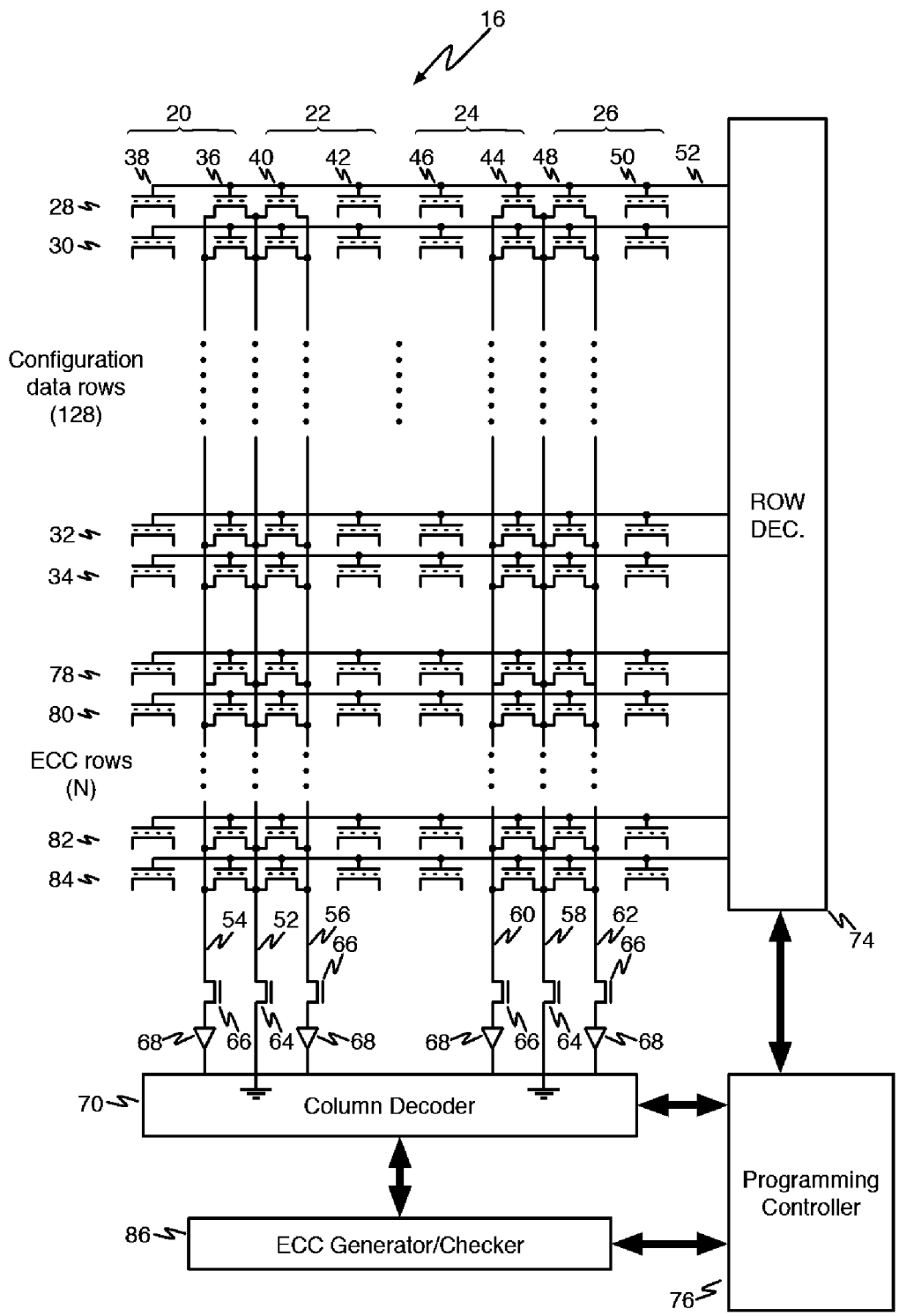
FIG. 2 is a diagram of a portion of an illustrative configuration memory block in an FPGA according to the present invention.

Referring now to FIG. 2, a diagram shows a portion of an illustrative non-volatile configuration memory block 16 in an FPGA according to the present invention. The portion of non-volatile configuration memory 16 will be referred to herein as a "block" and includes a plurality of rows and columns of memory cells. Persons of ordinary skill in the art will appreciate that a high-level implementation of the present invention is shown in FIG. 2, which illustrates only one block of memory cells and that an actual FPGA may be formed from a sea of these modules.

In the simplified illustrative arrangement of non-volatile configuration memory block 16 shown in FIG. 2, four columns of memory cells illustrated at reference numerals 20, 22, 24, and 26 are shown. In addition, N rows of memory cells are shown, four of which are illustrated at reference numerals 28, 30, 32, and 34. A typical number for N in a configuration memory block an actual FPGA integrated circuit might be 128. The total number of memory blocks in the FPGA integrated circuit will depend on the number of programmable circuits that need to be serviced by the configuration memory in the FPGA or other programmable logic device.

As also shown in FIG. 2, each memory cell in memory block 16 includes a sense transistor and a switch transistor. Representative pairs of sense transistors are shown in FIG. 2. In the first row 28 of the portion of the non-volatile memory 16, the memory cell in the first column 20 includes sense transistor 36 and switch transistor 38. The memory cell in the second column 22 of first row 28 includes sense transistor 40 and switch transistor 42. The memory cell in the third column 24 of first row 28 includes sense transistor 44 and switch transistor 46. The memory cell in the fourth column 26 of first row 28 includes sense transistor 48 and switch transistor 50. The control gates of all of the memory-cell transistors in the first row 28 are coupled to a row line 52 as is known in the art. Persons of ordinary skill in the art will appreciate that the configuration of the other rows of the portion of non-volatile configuration memory 16 is as described for the illustrative first row 28.

The common sources of the memory cells in the first and second columns 20 and 22 are coupled to a common source line 52. The common sources of the memory cells in columns 24 and 26 are coupled to a common source line 54. The drains of the sense transistors in the first column 20 of memory cells is coupled to a column line 56. The drains of the sense transistors in the second column 22 of memory cells is coupled to a column line 58. The common sources of the memory cells in the third and fourth columns 24 and 26 are coupled to a common source line 60. The common sources of the memory cells in columns 24 and 26 are coupled to a common source line 62. The drains of the sense transistors in the third column 24 of memory cells is coupled to a column line 64. The drains of the sense transistors in the fourth column 26 of memory cells is coupled to a column line 66. The common source lines are coupled to select transistors 64 and the column lines are coupled to column-select transistors 66. The column-select transistors 66 are coupled to sense amplifiers 68. A column-decoder circuit 70 is shown coupled to the sense amplifiers 68. Persons of ordinary skill in the art will recognize the column output circuitry.

Row line 52 and the other row lines are coupled to a row decoder circuit 74. Row decoder 74 addresses the rows of memory cells as is known in the art. Programming controller 76 is coupled to column decoder circuit 70 and to row decoder circuit 74 as is known in the art. The row and column decoder circuits 70 and 74 may be distributed across the FPGA on a block basis or may be common to the entire configuration memory.

The non-volatile configuration memory block 16 shown in FIG. 2 also includes M additional rows. Four such additional rows are indicated at reference numerals 78, 80, 82, and 84. These additional rows are used to store error-correction-code (ECC) data generated from the configuration data that is stored in the memory cells in the M rows including rows 28, 30, 32, and 34. Four such ECC rows are shown in FIG. 2, but, as indicated, the number of additional ECC rows is determined by the amount of error correction data desired. With M=9, two errors can be detected and one error can be corrected.

The ECC code generating and error detection is performed by ECC generator/checker 86, coupled to the column decoder 70 and the programming controller 76 for the entire non-volatile memory. ECC generator/checker 86 uses the incoming configuration data being programmed into the configuration memory to generate ECC data that are then stored in memory cells in rows 78, 80, 82, and 84 under the control of programming controller 76.

As will be appreciated by persons of ordinary skill in the art, there are numerous ECC algorithms that may be implemented by ECC generator/checker 86 and the present invention is intended to encompass use of any such ECC algorithm. The configuration of ECC generator/checker 86 will depend on the particular one of the ECC algorithms that it is to implement. Design of such an ECC generator/checker 86 will be a routine exercise for persons of ordinary skill in the art.

At boot up or at regular intervals the FPGA 10 can be put into integrity check mode. In this mode ECC generator/checker 86 reads the non-volatile configuration memory block by block and compares the data with the ECC data to check whether there are any errors. If there is a single bit error, the ECC data are used to find the location of the error and fix the error by reprogramming the bit having the error.

If the error is a programmed bit that has become erased, then data for the entire block can be stored in non-volatile memory on the integrated circuit, and the data in the block may be erased and then re-written using the data stored in the non-volatile memory altered by the corrected bit data, thus fixing the error bit that was detected using the ECC scheme. This is because non-volatile memories are usually "bulk" erased, meaning that the erase procedure is carried out simultaneously on blocks of memory cells. In most cases the error consists of a programmed bit that has become erased, and the present invention is able to repair the error without having to save the error block data in a non-volatile memory block.

Figure 3:
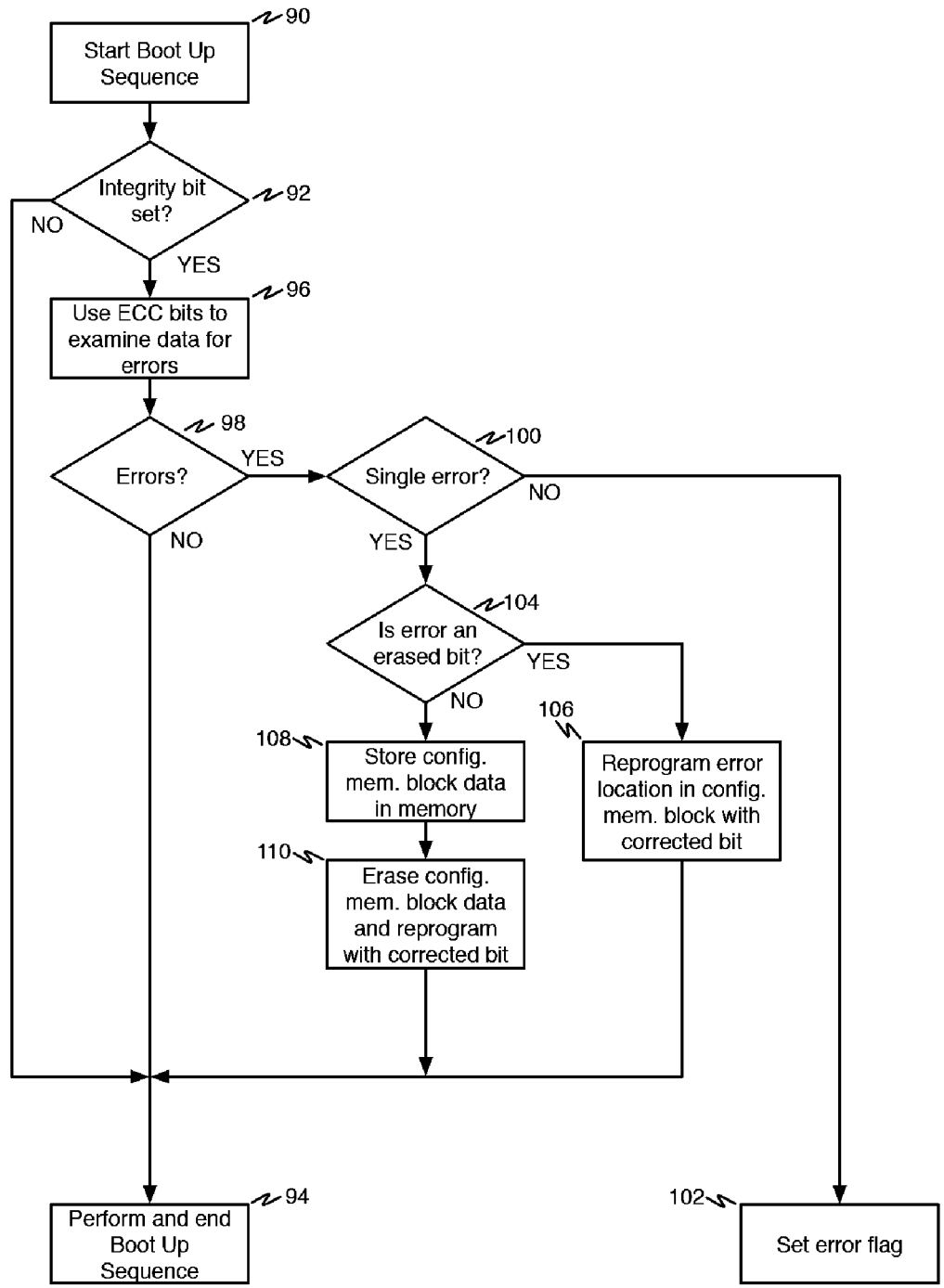
FIG. 3 is a flow diagram showing an illustrative method according to one aspect of the present invention.

Referring now to FIG. 3, a flow diagram shows an illustrative method according to one aspect of the present invention wherein the contents of the configuration memory are checked at bootup of the FPGA. Thus, at block 90, the bootup sequence of the FPGA is started. Next, at block 92, it is determined whether the integrity bit has been set. The integrity-check bit or bits is a location that is checked by the boot up sequence. If the bit is cleared, the normal boot up sequence is performed and ended at block 94. This portion of the process is optional.

If the integrity-check bit has been set, the ECC data are fetched from the non-volatile configuration memory and compared with ECC data generated from the data contents actually stored the block of configuration data stored in the non-volatile configuration memory at block 96. Next, at block 98, the stored ECC data is compared with the generated ECC data to determine if there are any errors in the configuration data stored in the non-volatile configuration memory. If the stored ECC data matches the generated ECC data, it is determined that there are no errors, the normal boot up sequence is performed and ended at block 94.

If the stored ECC data does not match the generated ECC data, it is determined at block 100 whether there are more errors than can be identified by bit location. In the example shown in FIG. 3, nine ECC rows allow a single error to be precisely located. If there are more errors than can be precisely located, the process proceeds to block 102, where an error flag is set. This error flag may be read through the JTAG port and can be used to initiate a reprogramming sequence for the FPGA using external known data.

If the particular bit(s) causing the errors can be identified, the process proceeds to block 104, where it is determined whether the error is a programmed bit that should have remained erased. If so, the process proceeds to block 106, where the erroneous erased bit is reprogrammed. The process then proceeds to block 94 for completion of the boot up sequence.

If it is determined that the error is an erased bit that should have been programmed, the process proceeds to block 108, where the data from all of the memory location in the block of data containing the erroneously-programmed location is stored in on-chip non-volatile memory or other memory such as SRAM. Next, at block 110, all memory locations in the block of data containing the erroneously-programmed location are erased and reprogrammed using the data that was read out and stored in non-volatile memory or other temporary storage modified by the correct data for the erroneously erased bit. The process then proceeds to block 94 for completion of the boot up sequence.

As previously mentioned, the process of FIG. 3 assumes a single identifiable error. Persons of ordinary skill in the art will appreciate that if a larger number of ECC bits are employed such that the location of more than one error can be exactly determined, the processes shown in blocks 104, 106, 108, and 110 are repeated for each identifiable error. Persons of ordinary skill in the art will recognize that performing this check during boot-up is merely exemplary and that this integrity check may be selectively performed at any other user-specified time. In such other embodiments, block 90 starts the process by which the contents of the configuration memory are checked, and block 94 is the end of the process by which the contents of the configuration memory are checked, without reference to system boot-up.

Using the disclosed example where nine additional rows are used to store ECC data, two bit errors can be detected and one bit error can be corrected without having access to the programming data for the entire configuration memory. The additional nine ECC rows added to the module column represent an additional area of about 8% for the core and an additional area of about 4% for the entire chip, assuming that the core is about 50% of the total die area.

Figure 4:
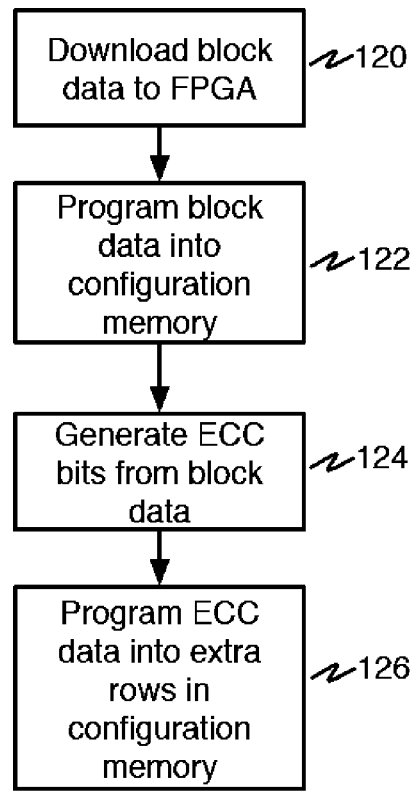
FIG. 4 is a flow diagram showing an illustrative method according to another aspect of the present invention.

Referring now to FIG. 4, an exemplary method for programming the non-volatile configuration memory of the present invention is shown. The method illustrated in FIG. 4 assumes that the ECC data is generated on chip from the configuration data that is downloaded to the FPGA. Persons of ordinary skill in the art will appreciate that the initial ECC data could also be generated in the FPGA programmer that downloads the data to the FPGA.

First, at block 120, the memory block data is downloaded into the FPGA. Next, at block 122, the downloaded data is programmed into the configuration memory block. Next, at block 124, ECC data for the configuration data is calculated by the ECC generator/checker. Next, at block 126, the ECC data is programmed into the ECC memory cells in the extra rows in the configuration memory block.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for correcting programming bit errors in a memory block in a configuration memory having ECC bits in an FPGA including:
    determining whether an integrity check bit is set;
    if the integrity-check bit is set, performing an integrity check to detect bit errors;
    if a single-bit error is detected, determining whether the error is an erroneous erased value or an erroneous programmed value;
    if the bit error is an erroneous erased value, reprogram the memory location containing the erroneous erased value;
    if the bit error is an erroneous programmed value, saving the memory block data in a non-volatile memory block, erasing the configuration memory block containing the error and reprogramming the configuration memory block containing the error using the corrected bit;
    if there is more than one error, setting an error flag.

2. The method of claim 1, performed during a boot-up sequence of the integrated circuit including the configuration memory.

3. The method of claim 1 further including reading the status of the error flag through an I/O port on the FPGA.

4. The method of claim 3 further including initiating a full reprogramming cycle for the FPGA if the error flag is set.

5. The method of claim 1 wherein reading the status of the error flag through an I/O port on the FPGA comprises reading the status of the error flag through a JTAG port on the FPGA.

* * * * *